US012581718B2

(12) United States Patent
Mehrotra

(10) Patent No.: US 12,581,718 B2
(45) Date of Patent: Mar. 17, 2026

(54) RAISED SOURCE/DRAIN TRANSISTOR

(71) Applicant: TEXAS INSTRUMENTS INCORPORATED, Dallas, TX (US)

(72) Inventor: Manoj Mehrotra, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 383 days.

(21) Appl. No.: 18/308,785

(22) Filed: Apr. 28, 2023

(65) Prior Publication Data

US 2024/0363434 A1 Oct. 31, 2024

(51) Int. Cl.
| | |
|---|---|
| *H10D 84/01* | (2025.01) |
| *H01L 21/02* | (2006.01) |
| *H10D 30/69* | (2025.01) |
| *H10D 62/13* | (2025.01) |
| *H10D 62/822* | (2025.01) |
| *H10D 84/03* | (2025.01) |
| *H10D 84/85* | (2025.01) |

(52) U.S. Cl.
CPC ..... *H10D 84/017* (2025.01); *H01L 21/02529* (2013.01); *H01L 21/02532* (2013.01); *H10D 30/797* (2025.01); *H10D 62/151* (2025.01); *H10D 62/822* (2025.01); *H10D 84/0184* (2025.01); *H10D 84/038* (2025.01); *H10D 84/85* (2025.01)

(58) Field of Classification Search
CPC .. H10D 84/017; H10D 30/797; H10D 62/151; H10D 62/822; H10D 84/0184; H10D 84/038; H10D 84/85; H10D 30/0275; H10D 62/021; H10D 64/021; H10D 84/0167; H01L 21/02529; H01L 21/02532
See application file for complete search history.

(56) References Cited

U.S. PATENT DOCUMENTS

| | | | |
|---|---|---|---|
| 6,051,473 A | 4/2000 | Ishida et al. | |
| 9,245,955 B2 * | 1/2016 | Zhang | H10D 84/038 |
| 2008/0217686 A1 * | 9/2008 | Majumdar | H10D 86/01 |
| | | | 438/222 |
| 2023/0260826 A1 * | 8/2023 | Or-Bach | H10D 88/00 |
| | | | 438/667 |
| 2023/0261088 A1 * | 8/2023 | Gu | H10D 30/6757 |
| | | | 257/329 |
| 2024/0096874 A1 * | 3/2024 | Nath | H10D 89/713 |
| 2024/0290863 A1 * | 8/2024 | Chiang | H10D 30/601 |

OTHER PUBLICATIONS

Raised Source/Drain (RSD) for 50nm MOSFETs—Effect of Epitaxy Layer Thickness on Short Channel Effects, A.M. Waite, et al., IEEE, 2003.

* cited by examiner

*Primary Examiner* — Karen Kusumakar
(74) *Attorney, Agent, or Firm* — Yudong Kim; Frank D. Cimino

(57) ABSTRACT

Transistors with raised source/drain structures and methods of making the transistors are described. A method for making such transistors includes forming a first gate and a second gate on a substrate, forming a p-doped region adjacent the first gate, and forming an n-doped region adjacent the second gate. The method further includes forming a silicon germanium (SiGe) region in a portion of the p-doped region. Subsequently, the method simultaneously forms raised source-drain structures over the SiGe region and on the n-doped region.

24 Claims, 14 Drawing Sheets

RAISED SOURCE/DRAIN TRANSISTOR

BACKGROUND

The manufacture of integrated circuits (ICs) involves numerous process steps to construct the elements of the various components on the IC. For example, a field effect transistor (FET) has a gate, a drain, and a source. Multiple process steps are performed to create the various structures that form the gate, drain, and source. Because a p-channel FET (PFET) is different than an n-channel FET (NFET), at least some of the process steps used to fabricate a PFET on a semiconductor wafer are different than the process steps used to fabricate an NFET and may be performed sequentially.

SUMMARY

In one example, a method includes forming a first gate and a second gate on a substrate, forming a p-doped region adjacent the first gate, and forming an n-doped region adjacent the second gate. The method further includes forming a silicon germanium (SiGe) region in a portion of the p-doped region and simultaneously forming raised source-drain structures over the SiGe region and on the n-doped region.

In another example, an apparatus includes an n-channel field effect transistor (NFET) having a raised source and a raised drain. The apparatus also includes a p-channel field effect transistor (PFET) having a raised source, a raised drain, and a gate and having first and second silicon germanium (SiGe) regions adjacent the gate.

DETAILED DESCRIPTION

Figure 1:
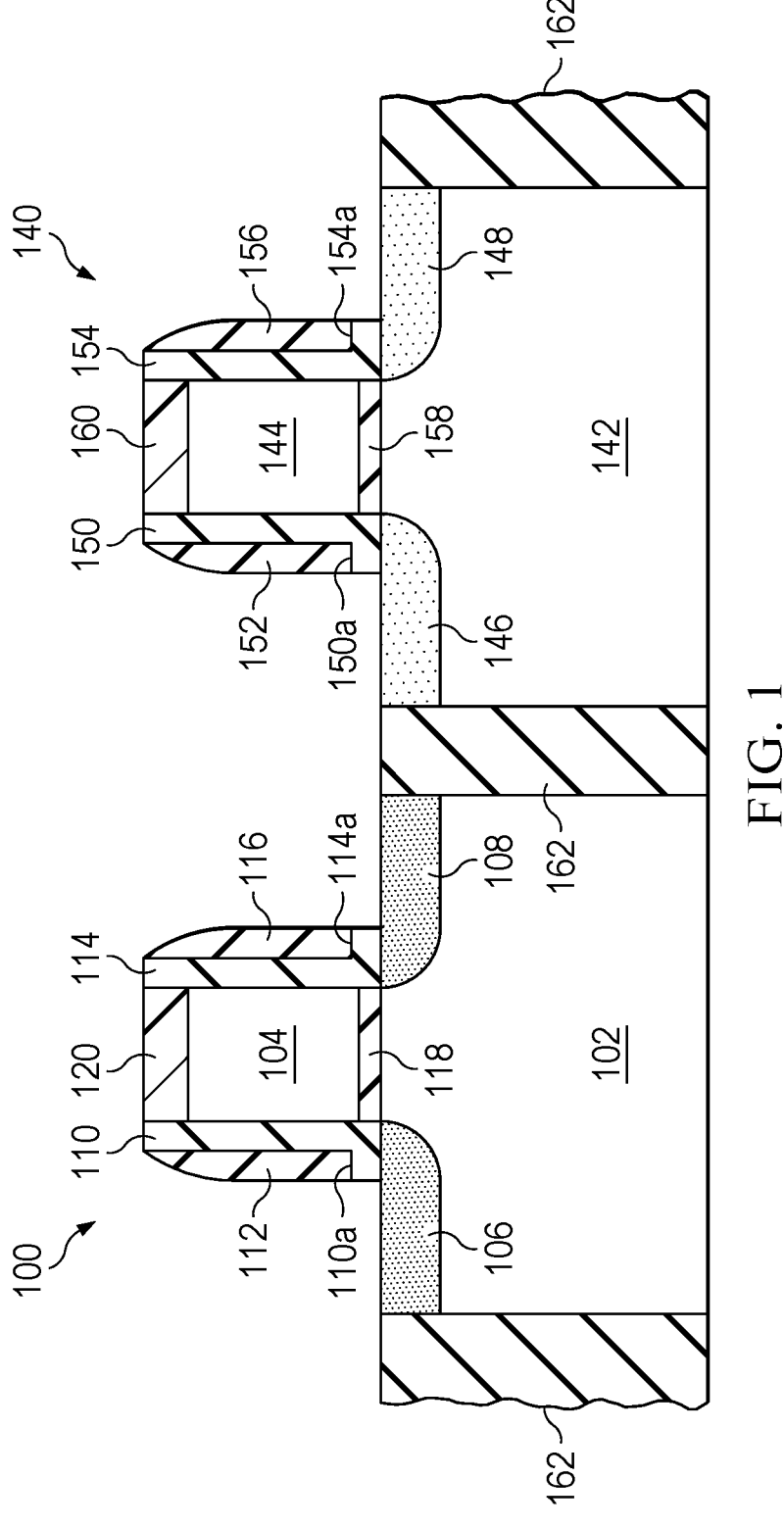
FIG. 1 is a cross-sectional view illustrating the formation of lightly doped n-type and p-type regions and gates within a respective NFET and PFET, in accordance with an example.

The same reference numbers or other reference designators are used in the drawings to designate the same or similar (either by function and/or structure) features. The term "approximately," as used herein, may refer to ±5% to ±10% variations of the recited values in some cases. In other cases, the term "approximately" may refer to ±10% to ±20% variations of the recited values.

FETs may have raised sources and raised drains (referred to as "raised source/drain" or "raised source-drain") to reduce series resistance without increasing leakage current. The term raised source/drain may refer to the raised source of a FET, the raised drain of the FET, or both the raised source and raised drain of the FET—e.g., with respect to a surface of a channel under a gate of the FET. By constructing the source and drain regions vertically, the overall device size can be reduced without sacrificing device performance (e.g., on-resistance) compared to a larger device but without a raised source/drain.

In one example, the fabrication of an integrated circuit (IC) with NFETs and PFETs that have raised source/drains may include process steps to form the raised source/drain for the PFETs. One or more of the process steps used to form the raised source/drain for the PFETs may be performed sequentially than process steps to form the raised source/drain for the NFETs. For example, the raised source/drain for a PFET may include the formation of embedded silicon germanium (SiGe) regions adjacent the PFETs' gates which exert compressive stress just below the gate to increase hole mobility through the channel between the source and drain. Embedded SiGe regions, however, may not be beneficial for the NFETs—e.g., in view of opposite electron mobility behavior under the compressive stress. Accordingly, after forming the raised source/drains of the PFETs, including the embedded SiGe regions, the raised source/drains of the NFETs may then be formed.

In the example described below with regard to FIGS. 1-13, the raised source/drains of both PFETs and NFETs can be formed simultaneously, that is, as part of the same process step(s) and not sequentially, as described above. By forming PFET and NFET raised source/drains simultaneously, advantageously fewer process steps are performed to fabricate the transistors.

FIGS. 1-13 are cross-sectional views of interim process steps during the fabrication of an NFET 100 and a PFET 140 on a semiconductor (e.g., silicon) substrate. In FIG. 1, for the NFET 100, n-type lightly doped extended regions 106 and 108 are formed in a p-type well (PWELL) 102. For the PFET 140, p-type lightly doped extension regions 146 and 148 are formed in an n-type well (NWELL) 142. The lightly doped extended regions 106 and 108 may be formed by, for example, ion implantation and thermal anneal processes. In one example, the n-type lightly doped extended regions 106 and 108 may have n-type doping species (n-type dopants) such as arsenic and phosphorous and have a doping concentration in the range of $1\times10^{18}/cm^3$ to $1\times10^{21}/cm^3$. The p-type lightly doped extension regions 146 and 148 may be formed by, for example, ion implantation and thermal anneal processes. In one example, the p-type lightly doped extension regions 146 and 148 may have p-type doping species (p-type dopants) such as carborane ($C_2B_{10}H_{12}$), boron, and boron difluoride (BF$_2$) and have a doping concentration in the range of $1\times10^{18}$/cm$^3$ to $1\times10^{21}$/cm$^3$.

Transistors 100 and 140 include respective gates 104 and 144 (e.g., polycrystalline silicon (polysilicon)). Gate dielectric layers 118 and 158 are formed between the gates 104 and 144, respectively, and the underlying PWELL 102 and NWELL 142. In one example, gate dielectric layers 118 and 158 include silicon oxide (silicon oxynitride), a high-K dielectric, or another suitable dielectric material. Spacers 110 and 114 are formed along the vertical side walls of the NFET's gate 104, and spacers 112 and 116 are formed along the vertical surfaces of spacers 110 and 114 opposite the gate 104. Similarly, spacers 150 and 154 are formed along the vertical side walls of the PFET's gate 144, and spacers 152 and 156 are formed along the vertical surfaces of spacers 150 and 154 opposite the gate 144.

The spacers 110, 114, 150, and 154 have an L-shaped cross-section, the L-shaped cross-sections having a ledge—e.g., portions 110a, 114a, 150a, and 154a of the spacers 110, 114, 150, and 154, which are disposed on the n-type lightly doped extended regions 106, 108 and on the p-type lightly doped extended regions 146, 148, respectively. Further, the spacers 112, 116, 152, and 156 are on the respective ledges 110a, 114a, 150a, and 154a of the spacers 110, 114, 150, and 154. In one example, spacers 110, 114, 150, and 154 include an oxide (e.g., silicon oxide). Spacers 110, 114, 150, and 154 may be formed, for example, by chemical vapor deposition (CVD) or thermal oxidation. Spacers 112, 116, 152, and 156 may include bis-tertiary butyl amino silane (BTBAS) or hexa chlorodisilane (HCD) nitride (e.g., silicon nitride).

Hardmasks 120 and 160 are formed on the top of gates 104 and 144. The hardmasks 120, 160 may be selective to other nitrides for wet etching using hydrogen fluoride (HF) or hot phosphorous (H$_2$PO$_4$) chemistries and include, for example, a nitride (e.g., nitride forming the spacers 112, 116, 152, and 156) or oxynitride material. In some examples, the hardmasks 120 and 160 may be a CVD nitride or silicon rich nitride (SRN). The density and etch rate of the hardmasks 120 and 160 can be controlled by various pre and/or post deposition plasma treatments in hydrogen or nitrogen as well as deposition temperature and atomic contents (precursors used). The spacer and hardmask nitride material (e.g., nitrogen, oxygen, carbon, hydrogen, etc.) is selected to modulate the stress, hardness, and etch selectivity within the nitrides and relative to the oxides and silicon.

Shallow trench isolation (STI) regions 162 are formed along the sides of the transistors 100 and 140 to isolate the transistors from each other and/or from other components on the IC. The STI 162 may be formed by, for example, silicon etch and dielectric fill, and may include a thin liner followed by high density plasma (HDP) or high aspect ratio process (HARP) oxide fill with densification and CMP.

Figure 2:
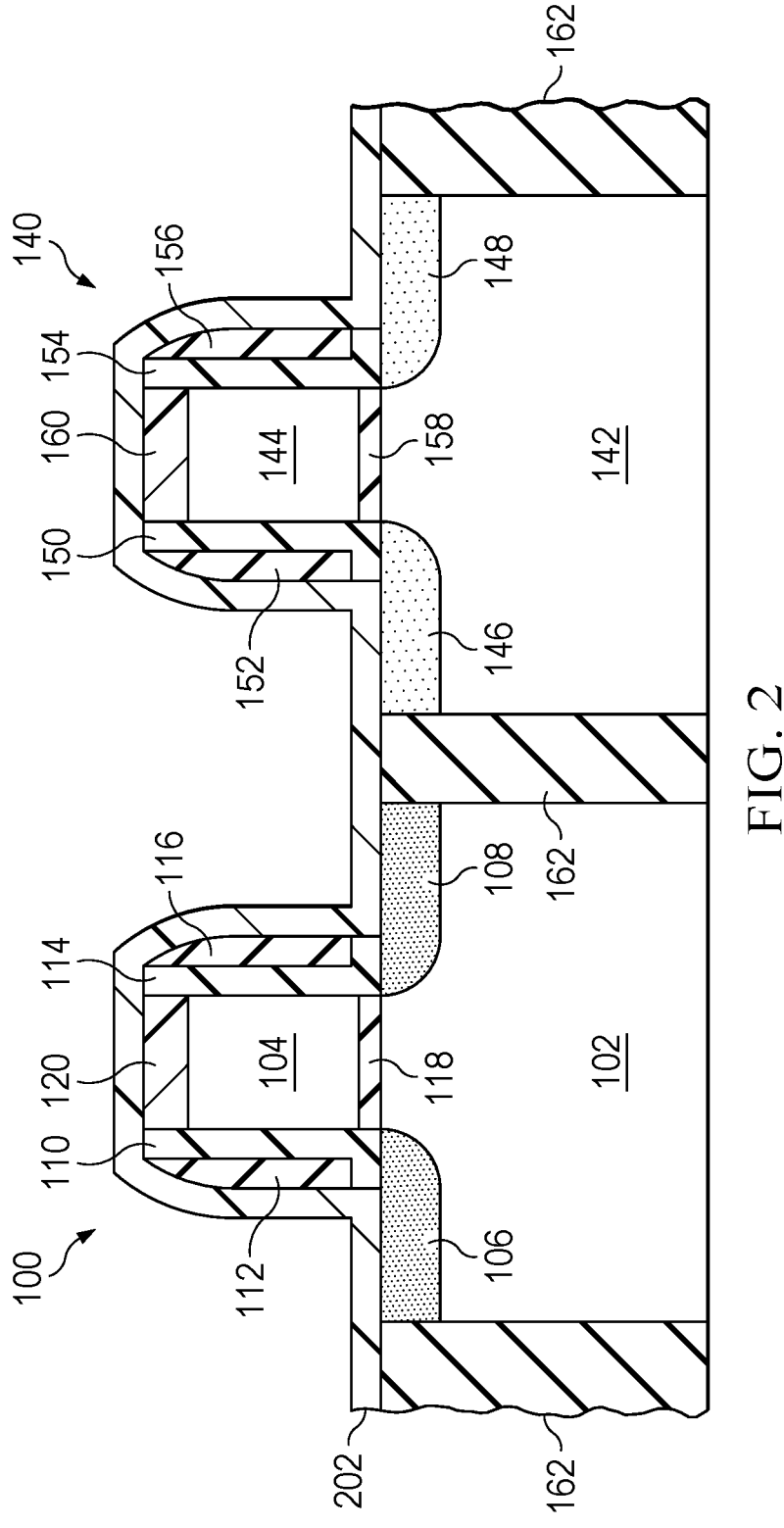
FIG. 2 is a cross-sectional view illustrating the formation of a silicon germanium (SiGe) hardmask over the NFET and PFET, in accordance with an example.

FIG. 2 illustrates the formation of a hardmask 202 covering both partially-formed transistors 100 and 140. The hardmask 202 may be resistant to, for example, SiGe formation (described below) and thus may be referred to as a SiGe hardmask 202. In one example, the SiGe hardmask 202 may be formed by a CVD process and may include a thin silicon-nitride or HCD nitride layer (e.g., a few hundred angstroms thick). The density and etch rate of the SiGe hardmask 202 can be controlled by various pre and/or post deposition plasma treatments in hydrogen or nitrogen. As such, the SiGe hardmask 202 can be removed, described below, without also completely removing the hardmasks 120, 160 or spacers 112, 116, 152, or 156.

The SiGe regions, noted above, may be formed within the PFET 140. In one example, a SiGe region is formed within a portion of each of the p-type lightly doped extension regions 146 and 148. To form the SiGe regions, the SiGe hardmask 202 is patterned to remove that portion of the SiGe hardmask 202 over the PFET 140 so that the SiGe regions can be formed within the source and drain structures of the PFET 140. In one example, a photoresist is formed over transistors 100 and 140. A mask (not shown) is then placed over the wafer, and a portion of the photoresist over the PFET 140 is removed by, for example, exposing the photoresist to ultraviolet light through the mask (the portion of the mask over the PFET 140 is transparent to ultraviolet light).

Figure 3:
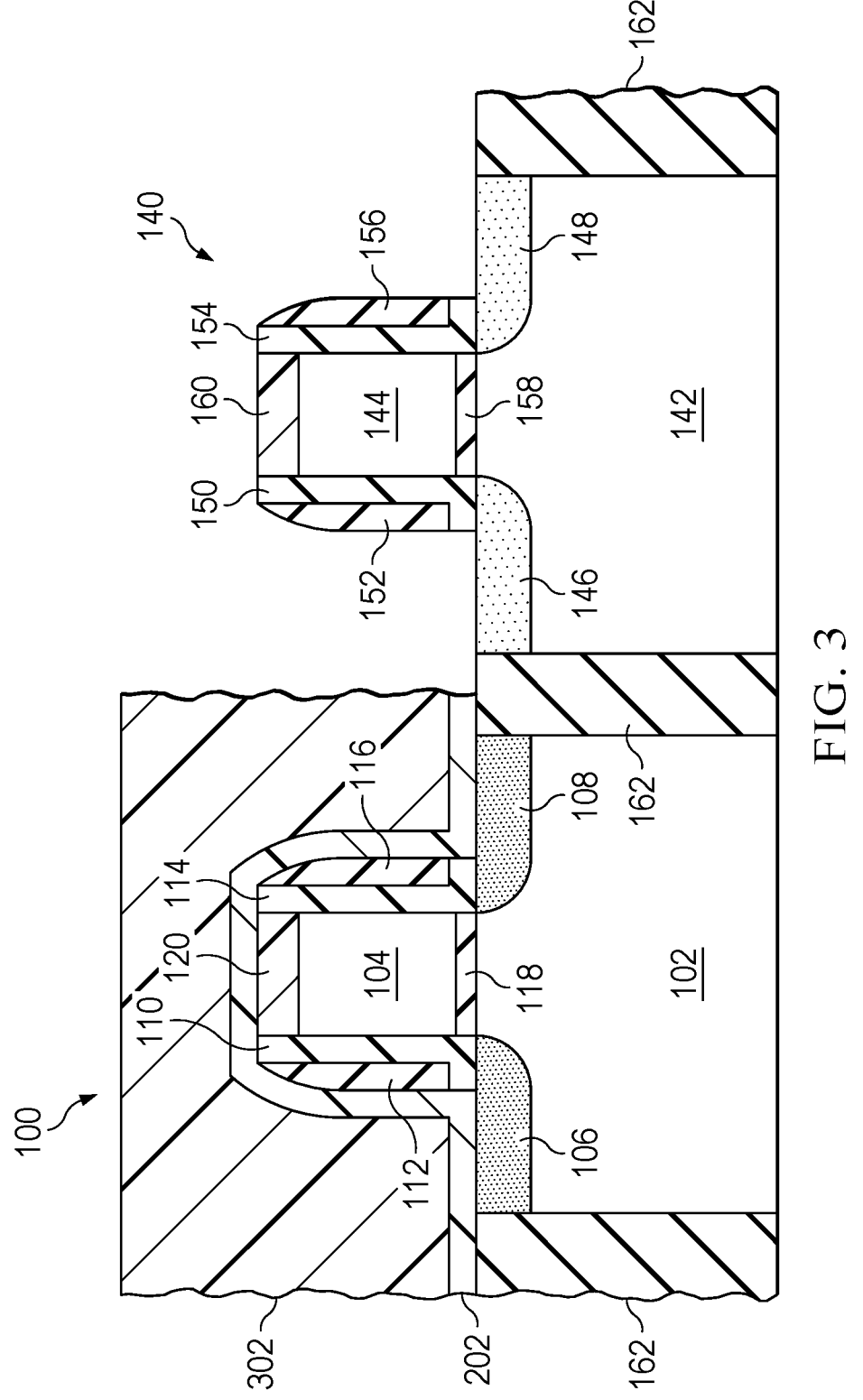
FIG. 3 is a cross-sectional view illustrating the patterning of the SiGe hardmask through a formation of photoresist over the NFET, in accordance with an example.

FIG. 3 illustrates that photoresist 302 remains over the NFET 100 because the mask over the NFET 100 is opaque to ultraviolet light. The SiGe hardmask 202 over the PFET 140 (and thus not covered by photoresist 302) is removed. Any suitable process for removing the exposed SiGe hardmask 202 can be performed such as a wet etch that removes the SiGe hardmask but not the underlying structures of transistor 140 such as the p-type lightly doped extension regions 146 and 148 as well as the spacers 152 and 156. Alternatively, a dry etch process can be performed. In one example of a dry etch process, a timed (or end-pointed) anisotropic dry etch is performed followed by an isotropic dry etch process.

Figure 4A:
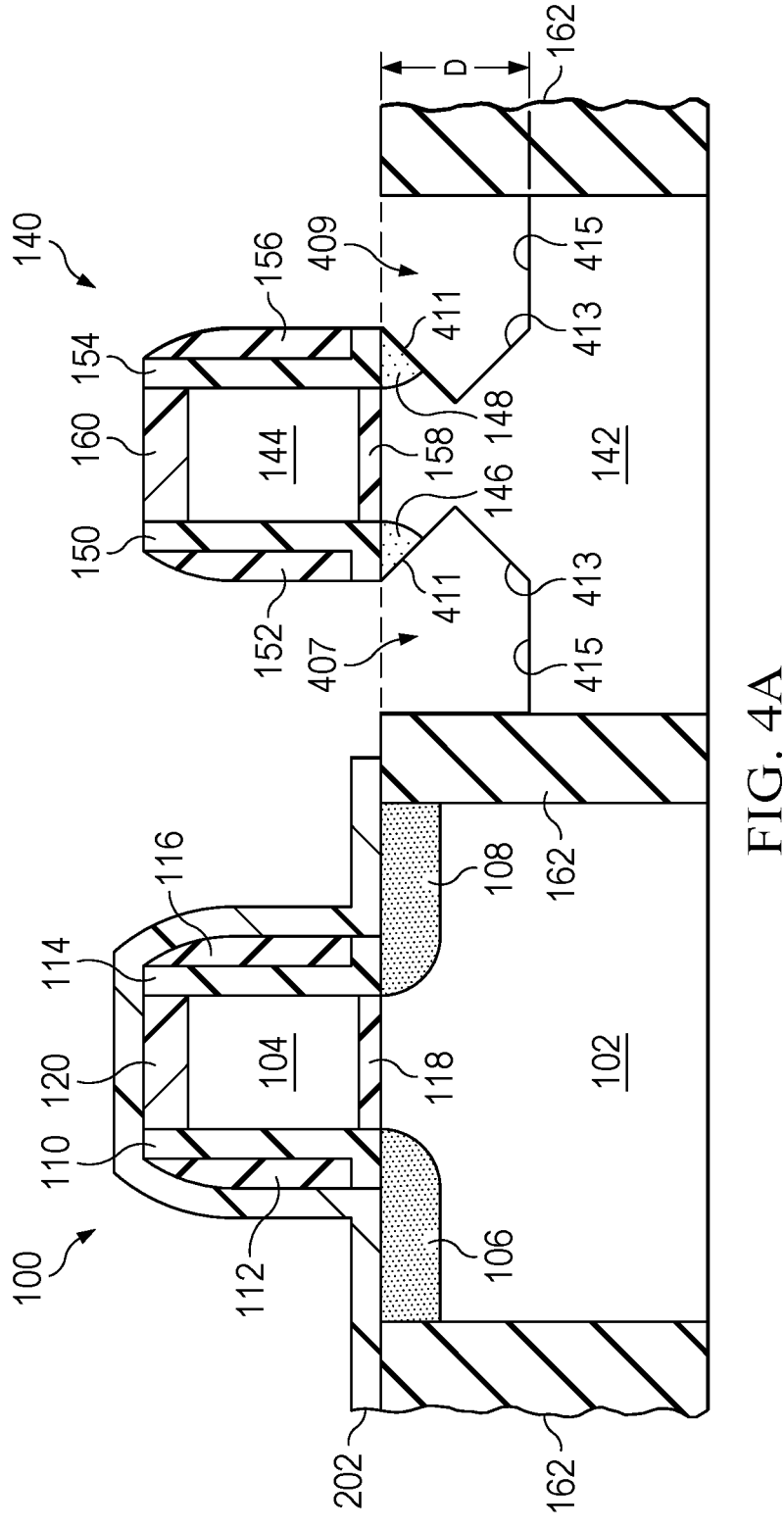
FIGS. 4A and 4B are cross-sectional views illustrating SiGe formation in the PFET, in accordance with an example.

In FIG. 4A, cavities 407 and 409 are formed within at least some of the p-type lightly doped extension regions 146 and 148. In one example, cavities 407 and 409 may be formed by first performing a dry etch of the p-type lightly doped extension regions 146 and 148 followed by a wet etch to create cavities (or recess) within at least a portion of the p-type lightly doped extension regions 146 and 148. The result of the two-step etch process is the creation of cavities in which the inner edge of each cavity (the edge closest to the gate 144) has two surfaces 411 and 413 formed at an angle with respect to each other. Surface 415 is the bottom surface of the cavities. In other examples (e.g., substrates with different crystal orientations, utilizing different wet etch chemistry), the result of forming the cavity may result in a generally rectangular shape in cross-section or a shape similar to that shown in FIG. 4A, but with a curved inner edge instead of an angled inner edge. Because the NFET 100 is still covered with the SiGe hardmask 202, cavities do not form within the NFET as a result of the etch processes that form the cavities in the PFET 140.

In some examples, the cavities 407 and 409 have a depth (denoted as "D" in FIG. 4A) varying between approximately 40 nm to approximately 80 nm. As shown in FIG. 4A, the cavities 407 and 409 may be aligned with ends of the ledges of the spacers 150 and 154 (e.g., the surface 411 terminating at the end of the ledge) in view of the spacers 150/152, 154/156 being used as a mask against the etch processes forming the cavities 407 and 409. In other examples, the cavities 407 and 409 may extend underneath the ledge of the spacers 150 and 154 (e.g., the surface 411 terminating underneath the ledge) as a result of over-etch associated with the etch processes forming the cavities 407 and 409.

Figure 4B:
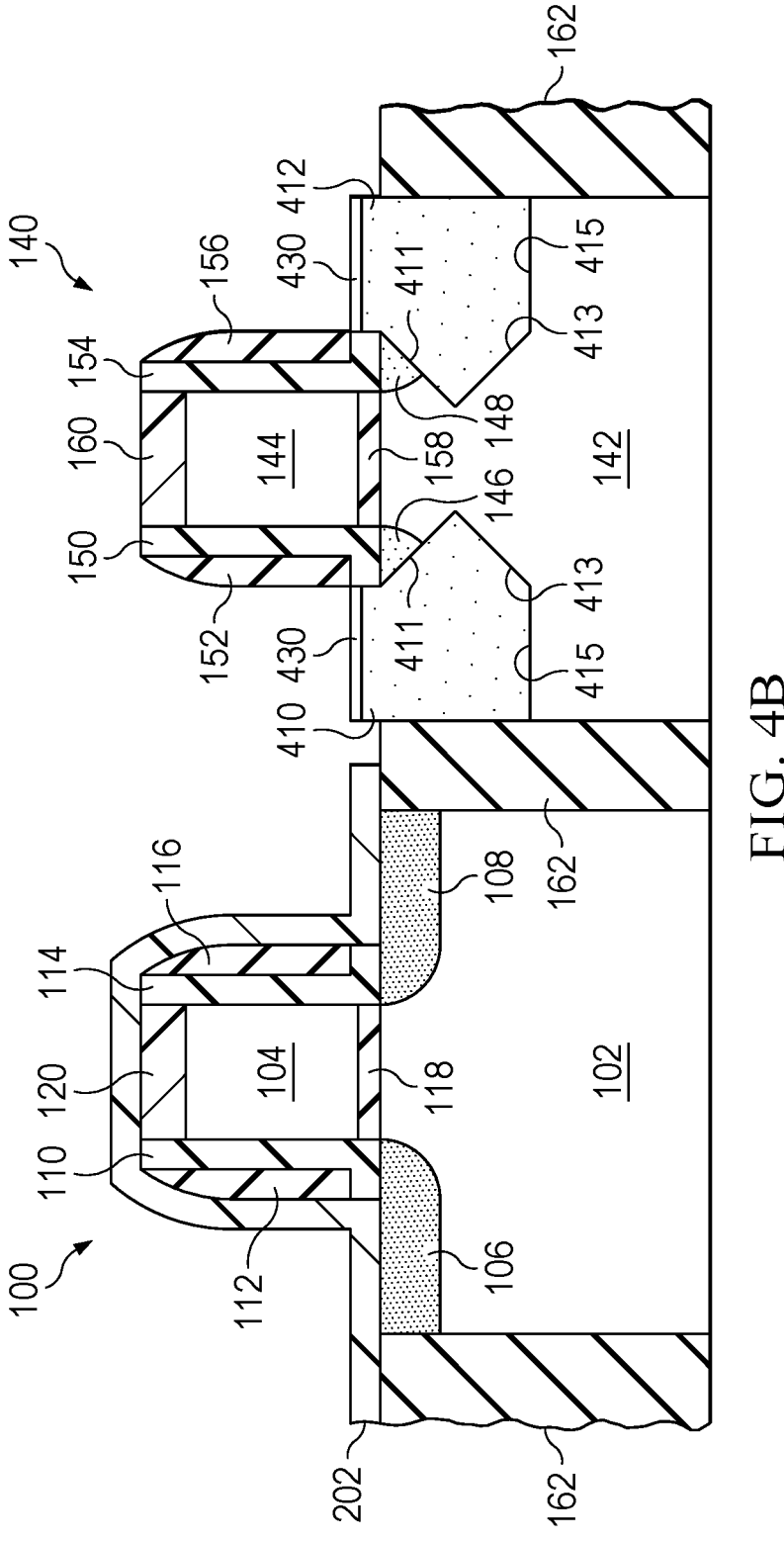

FIG. 4B illustrates an epitaxial process is then performed to grow SiGe 410 and 412 filling the cavities 407, 409. SiGe begins to grow along the surfaces 411, 413, 415 of the cavities and eventually fills the cavities with SiGe thereby forming SiGe regions 410 and 412. In one example, the epitaxial process to grow SiGe 410, 412 in the cavities 407, 409 may include a high germanium concentration (e.g., 30-40%). In another example, the epitaxial process may produce a graded concentration of germanium from a relatively low germanium concentration near surfaces 411, 413, and 415 to a higher concentration away from surfaces 411, 413, and 415 (e.g., 30-40%).

The SiGe 410 and 412 may overfill the cavities 407 and 409. In other words, the SiGe 410 and 412 may extend above the original surface of the p-type lightly doped extension regions 146 and 148—e.g., by approximately between 10 nm to 30 nm. A boron pre-cursor may be used as part of this epitaxial process. The epitaxial process growing the SiGe 410 and 412 may also form a thin silicon capping layer 430 (e.g., approximately 10 nm or less) on the SiGe 410 and 412. The silicon capping layer 430 may be undoped or boron-doped.

SiGe forms a crystalline structure. The lattice constant of the SiGe crystalline structure is larger than that of the underlying silicon (p-type lightly doped extension regions 146, 148 or NWELL 142). Because of the larger lattice constant of the crystalline SiGe regions 410 and 412, the SiGe regions exert compressive force in the area just below the gate dielectric layer 158 where the transistor's channel will form. The stress caused by the compressive force exerted by the SiGe regions 146 and 148 in this region advantageously causes an increase in hole mobility (the carrier conducting current between the source and drain when the PFET 140 turns on) through the PFET's channel.

Figure 5:
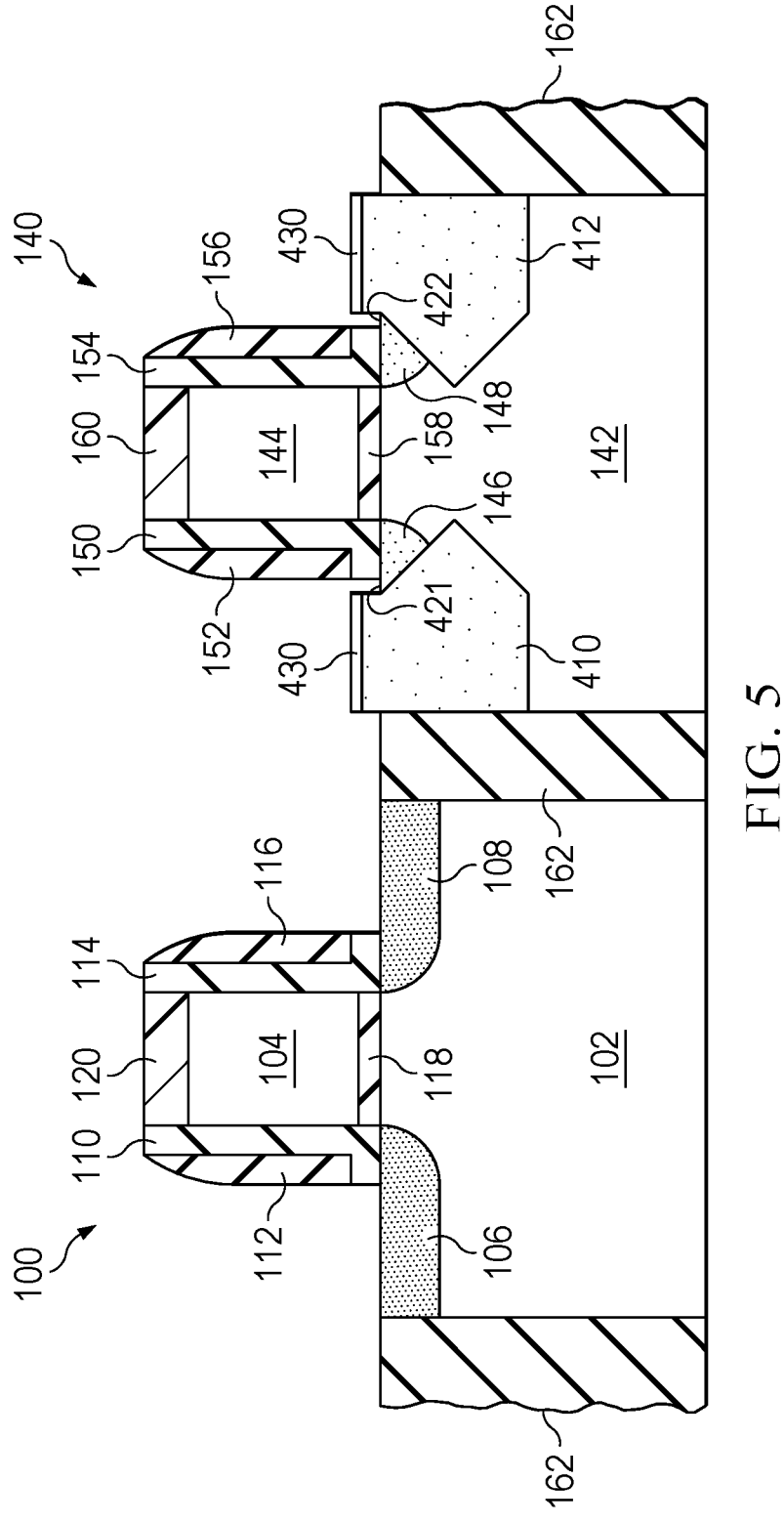
FIG. 5 is a cross-sectional view illustrating the removal of the SiGe hardmask, in accordance with an example.

In FIG. 5, the remaining SiGe hardmask 202 from the NFET 100 has been removed. The SiGe hardmask 202 may be removed, by example, by a wet etch of nitride using $H_2PO_4$ chemistries at low or high temperatures. As described above, removing the SiGe hardmask 202 may not also completely remove the hardmasks 120, 160 or spacers 112, 116, 152, or 156. The process in which the SiGe hardmask 202 is removed from NFET 100 may also cause some of the spacers 150, 152, 154, and 156 to be removed resulting in some of the p-type lightly doped extension regions 146 and 148 to be exposed as exposed regions 421 and 422.

Figure 6:
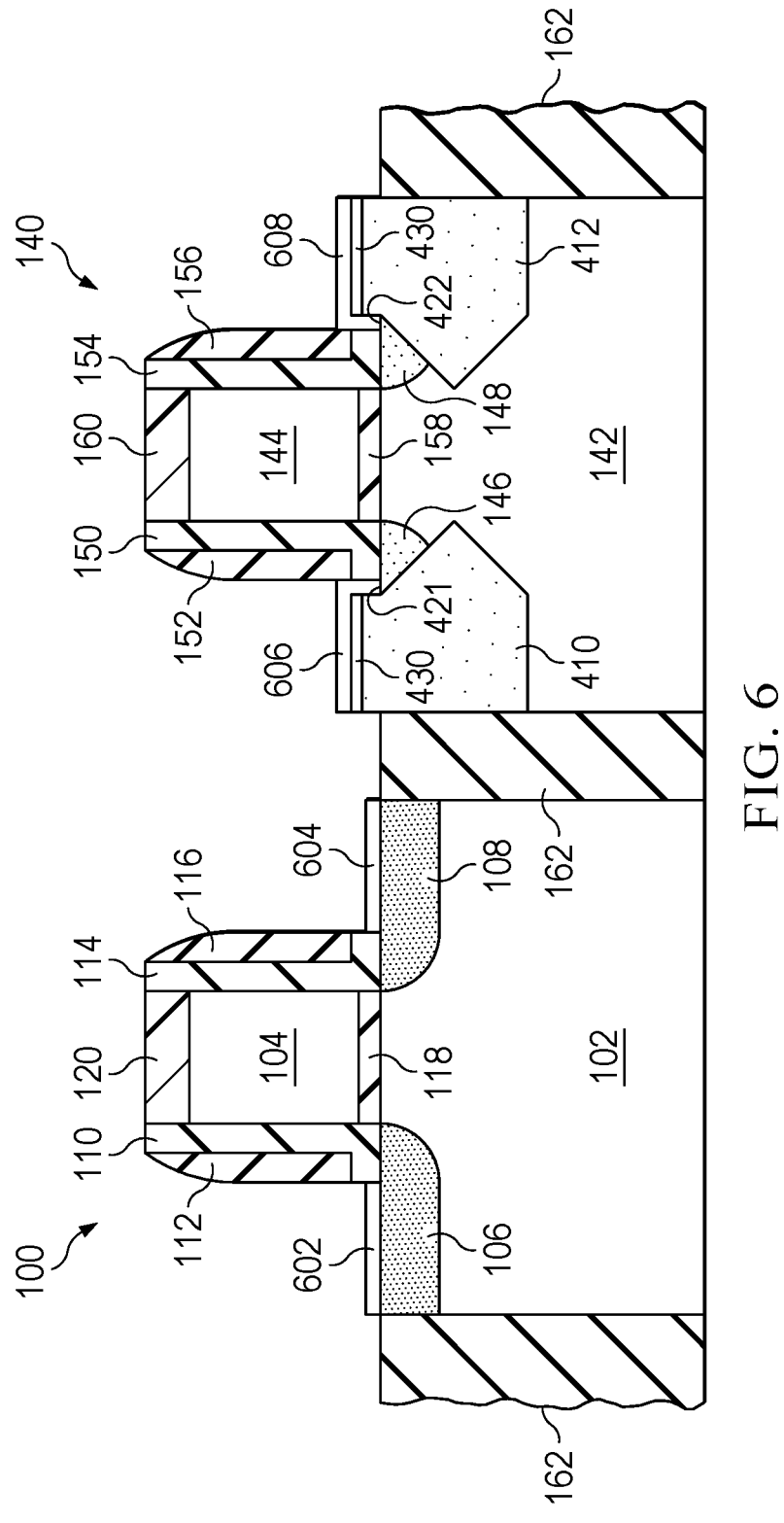
FIG. 6 is a cross-sectional view illustrating the formation of undoped silicon on the source and drain regions of the NFET and PFET, in accordance with an example.

In FIG. 6, silicon overfill regions 602 and 604 are formed over the n-type lightly doped extension regions 106 and 108 of the NFET 100, and silicon overfill regions 606 and 608 are formed over the SiGe regions 410 and 412 of the PFET 140 (e.g., on the silicon capping layer 430). The silicon overfill regions 602, 604, 606, and 608 may include undoped silicon. In some examples, a total thickness of the silicon overfill region 606 (or 608) and the silicon capping layer 430 may vary between approximately 10 nm and approximately 30 nm. As such, a thickness of the silicon overfill regions 602 and 604 on the n-type lightly doped extension regions 106 and 108 of the NFET 100 may be less than the total thickness of the silicon overfill region 606 (or 608) and the silicon capping layer 430 on the SiGe 410 and 412 of the PFET 140. The undoped silicon overfill regions 602, 604, 606, and 608 advantageously facilitating simultaneous formation of the raised source/drain for both the NFET 100 and PFET 140 rather than forming the raised source/drain of the NFET in a separate (sequential) process step than for the PFET. The process of forming the silicon overfill regions 602, 604, 606, and 608 may include a cleaning step that prepares the surface for epitaxial growth of the undoped silicon without significantly etching away the n-type lightly doped extension regions 106 and 108 (or the exposed regions 421 and 422) or the SiGe regions 410 and 412. The cleaning process may include dilute hydrofluoric acid, hydrochloric acid, SC1 cleans, and/or in-situ SiConi™ cleans. To the extent the portions 421 and 422 of the p-type lightly doped extension regions 146 and 148 are exposed as explained above, the silicon overfill regions 606 and 608 may cover such exposed regions 421, 422—e.g., the undoped silicon epitaxially growing on the exposed regions 421, 422.

Figure 7:
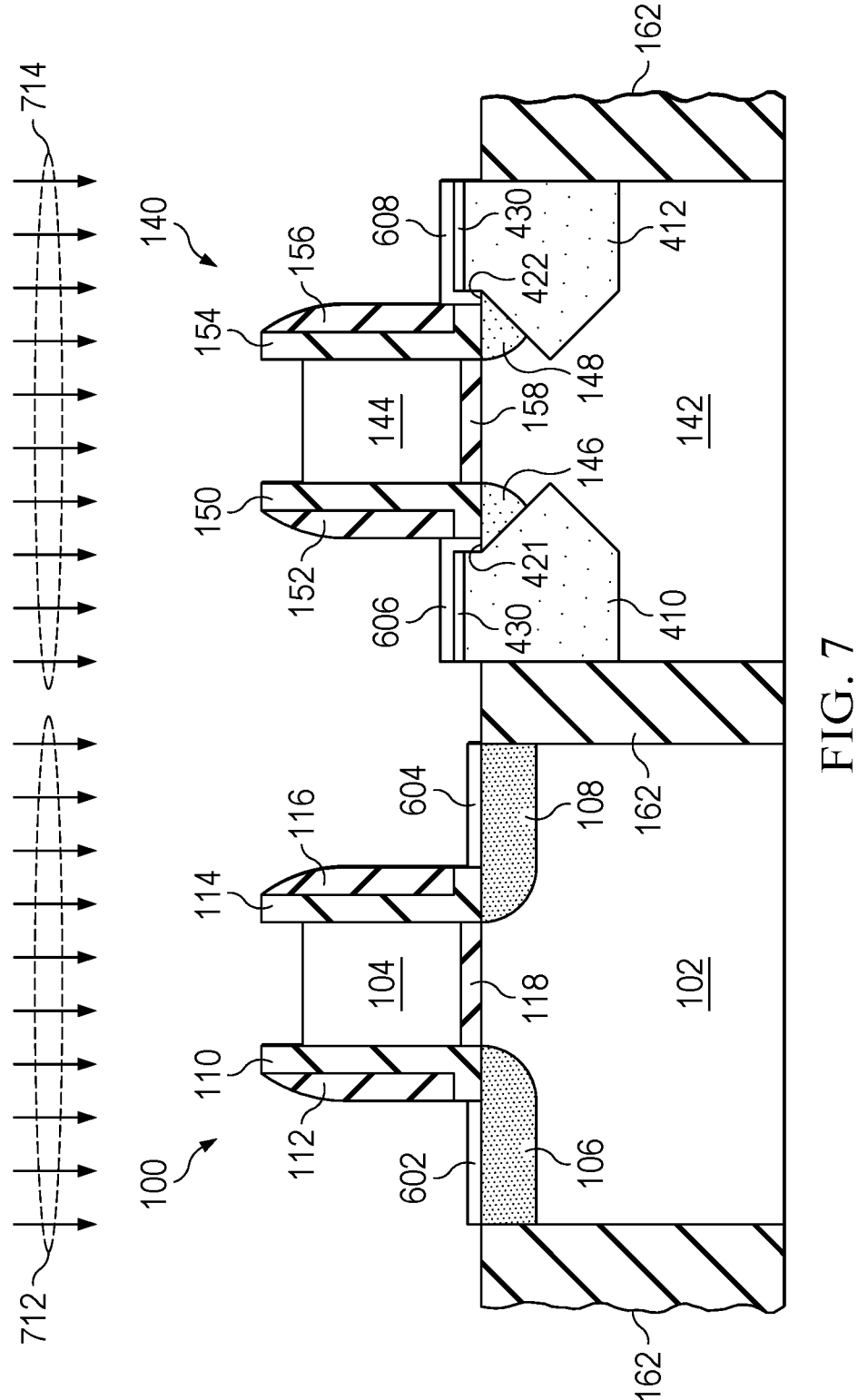
FIGS. 7 and 8 are cross-sectional views illustrating doping of the raised source and drain regions and gates of the NFET and PFET, in accordance with an example.

In FIG. 7, the hardmasks 120 and 160 on gates 104 and 144, respectively, are removed (e.g., by HF or hot phosphorous based etch chemistries), followed by selectively doping (as indicated by arrows 712 and 714) the silicon overfill regions 602 and 604 (n-type doping) and the silicon overfill regions 606 and 608 (p-type doping), as well as the gate 104 (n-type doping) and gate 144 (p-type doping). The selective doping may be performed by, for example, patterning a photoresist exposing the NFET 100 (while covering the PFET 140) to implant an n-type dopant (e.g., phosphorus, arsenic, antimony), and patterning another photoresist exposing the PFET 140 (while covering the NFET 100) to implant a p-type dopant (e.g., boron, indium), respectively. Subsequently, the n-type and p-type dopants may be activated by thermal anneals.

Figure 8:
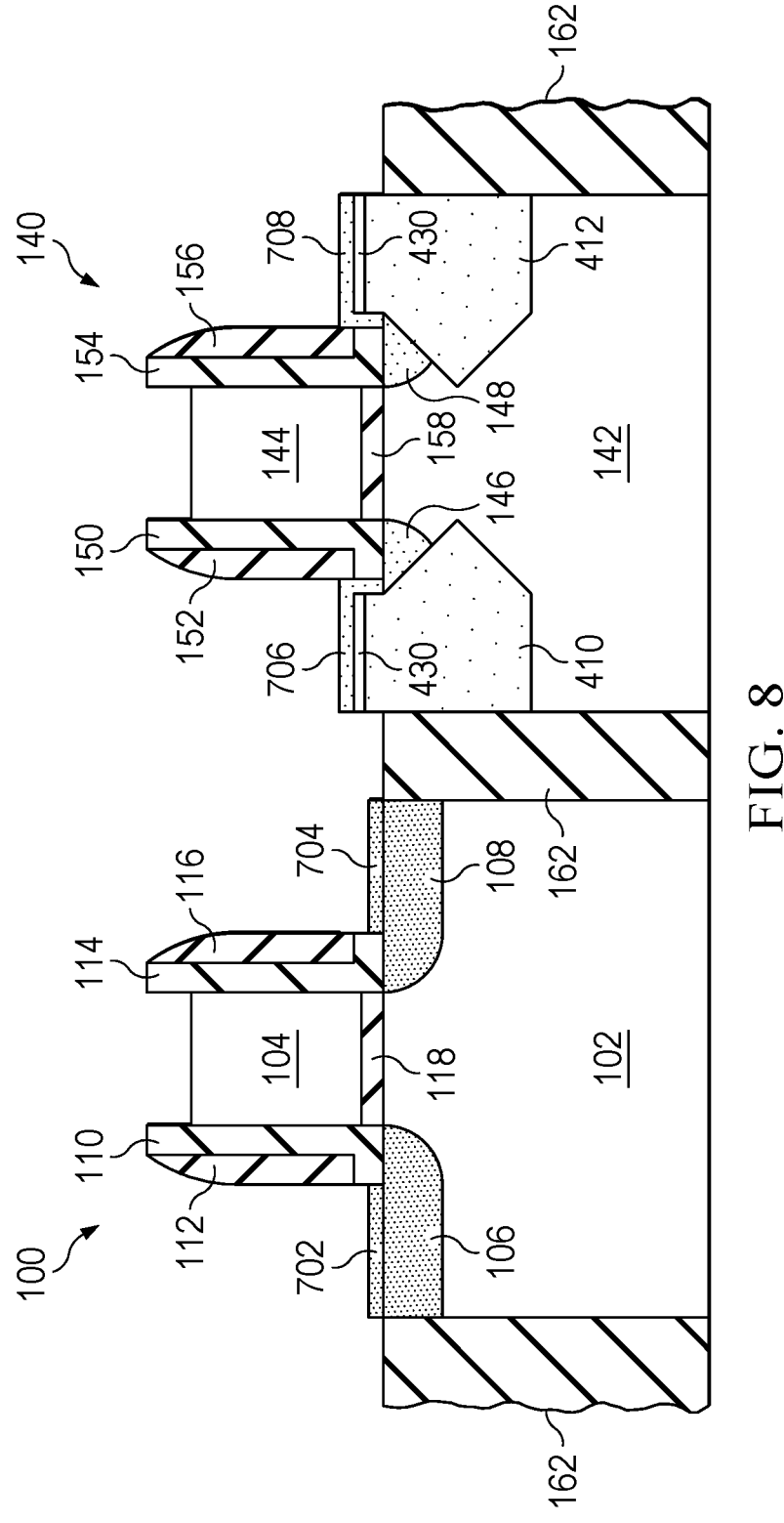

In FIG. 8, the silicon overfill regions 602, 604, 606, and 608 are shown in different shading as raised doped regions 702, 704, 706, and 708, respectively, to visually indicate the doping of the previously undoped silicon overfill regions 602, 604, 606, and 608. In some examples, the silicon capping layer 430 is also doped p-type with the p-type dopants of the raised doped regions 706, 708. As a result, the n-type raised silicon overfill regions 702 and 704 form the raised source/drain of the NFET 100 while the p-type raised silicon overfill regions 706 and 708 (in conjunction with the p-doped silicon capping layer 430 in some examples) form the raised source/drain of the PFET 140.

Figure 9:
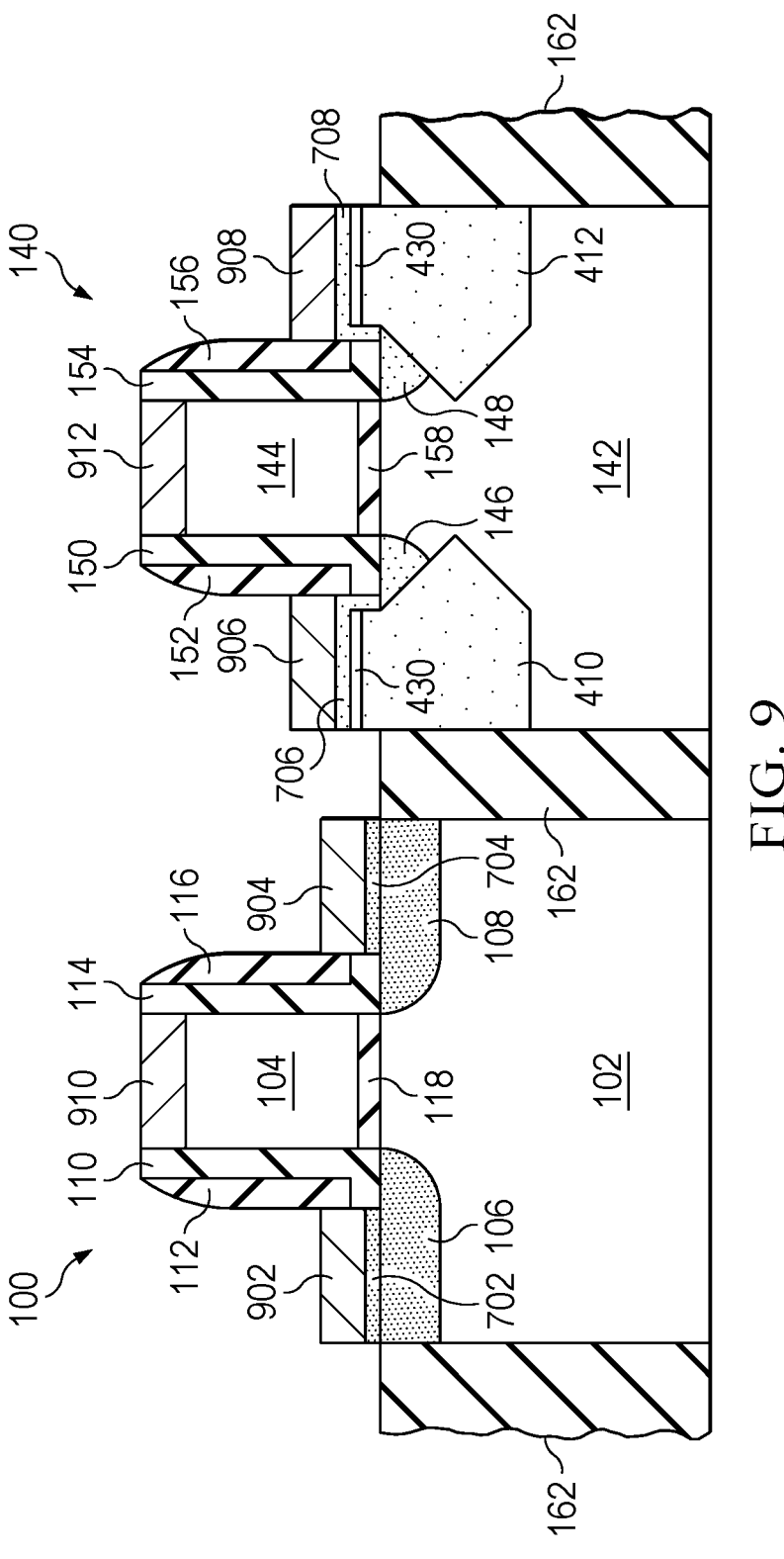
FIG. 9 is a cross-sectional view illustrating silicide formation on the raised source/drain and gates of the NFET and PFET, in accordance with an example.

In FIG. 9, silicide 902, 904, 906, and 908 is formed on the raised source/drain of each transistor 100 and 140, and silicide 910 and 912 is formed on the gates 104 and 144 of the transistors. Any suitable technique for forming silicide may be performed. Examples of silicide formation techniques include metal deposition on the exposed raised source/drain silicon followed by thermal heating, laser irradiation or ion beam mixing. The metal in contact with silicon (e.g., the raised source/drain silicon 702, 704, 706, and 708, the polysilicon of the gates 104, 144) forms silicide while unreacted metal can be subsequently removed. In this manner, silicide formation is aligned to the underlying exposed silicon regions, thus a self-aligned silicide process. The self-aligned silicide may include cobalt silicide (CoSi), nickel silicide (NiSi), or nickel platinum silicide (NiPtSi).

Figure 10:
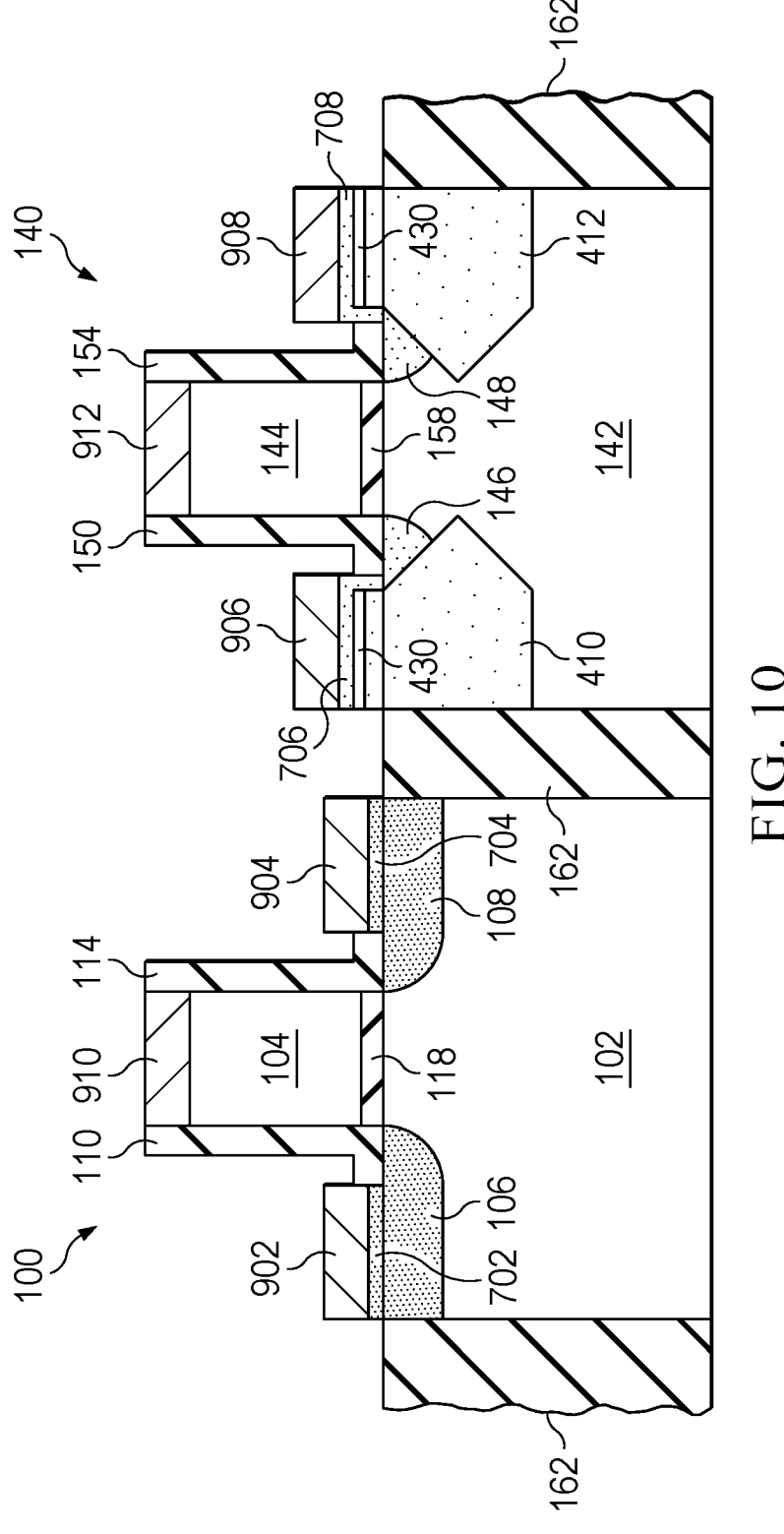
FIG. 10 is a cross-sectional view illustrating the removal of spacers associated with the gates of the NFET and PFET, in accordance with an example.

In FIG. 10, spacers 112, 116, 152, and 156 are removed or reduced. In other examples, the spacers 112, 116, 152, and 156 may not be removed. In an example in which the spacers 112, 116, 152, and 156 are removed, the spacers 112, 116, 152, and 156 are removed by non-selective nitride removal process using hot phosphorous chemistries that may remove the nitrides on the wafer while being selective to silicide and oxide.

Figure 11:
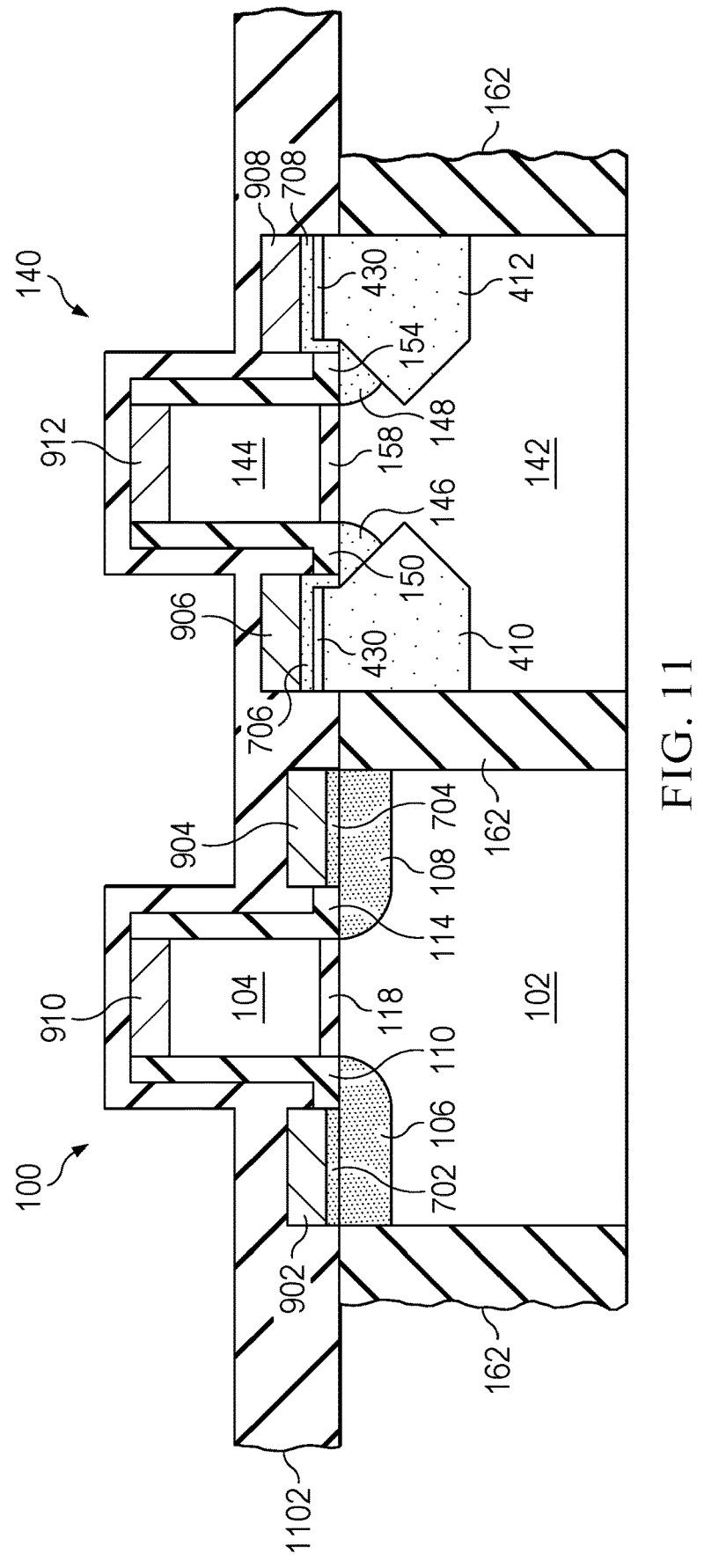
FIG. 11 is a cross-sectional view illustrating pre-metal dielectric liner formation on the NFET and PFET, in accordance with an example.
Figure 12:
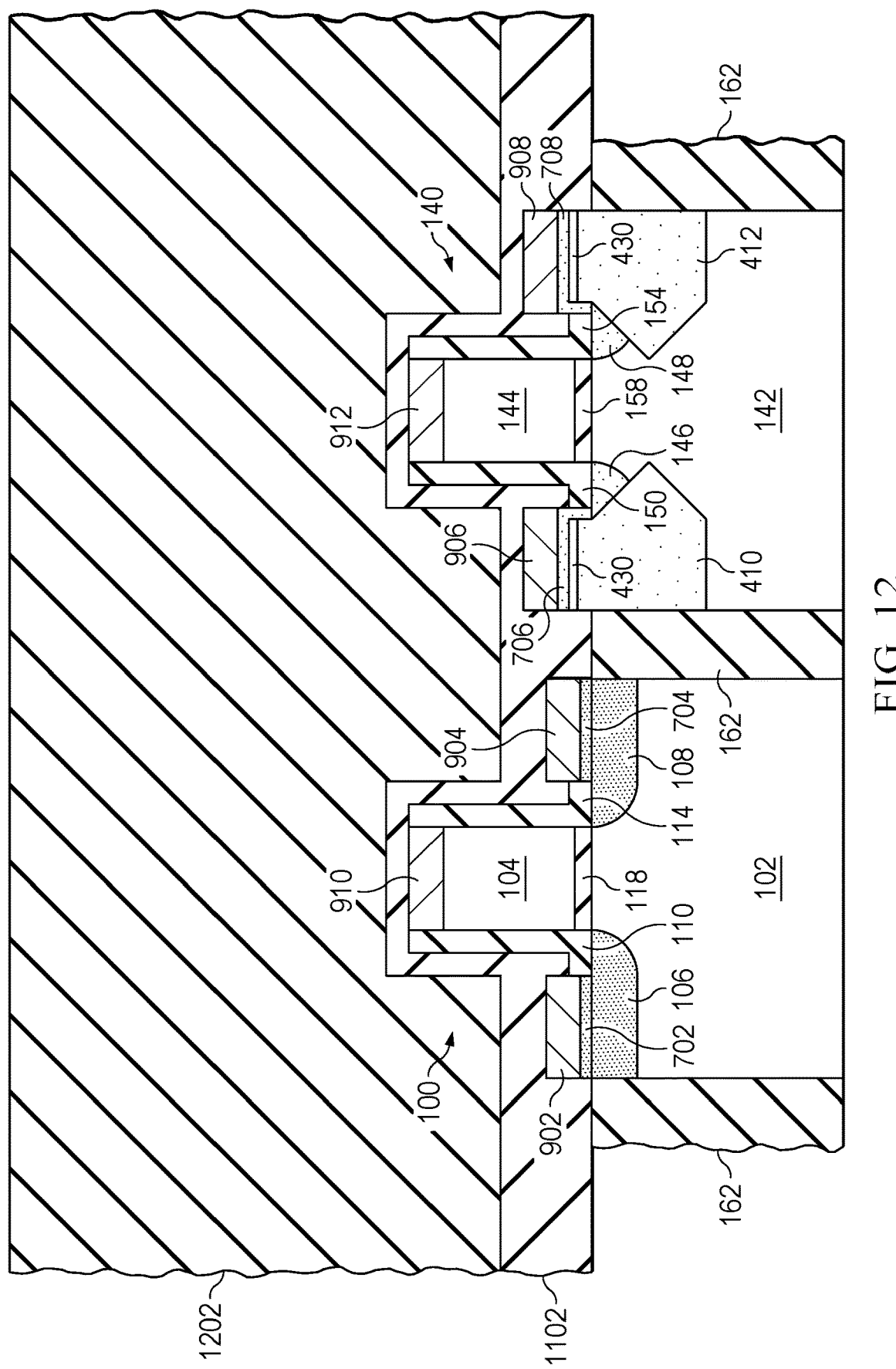
FIG. 12 is a cross-sectional view illustrating pre-metal dielectric fill, in accordance with an example.
Figure 13:
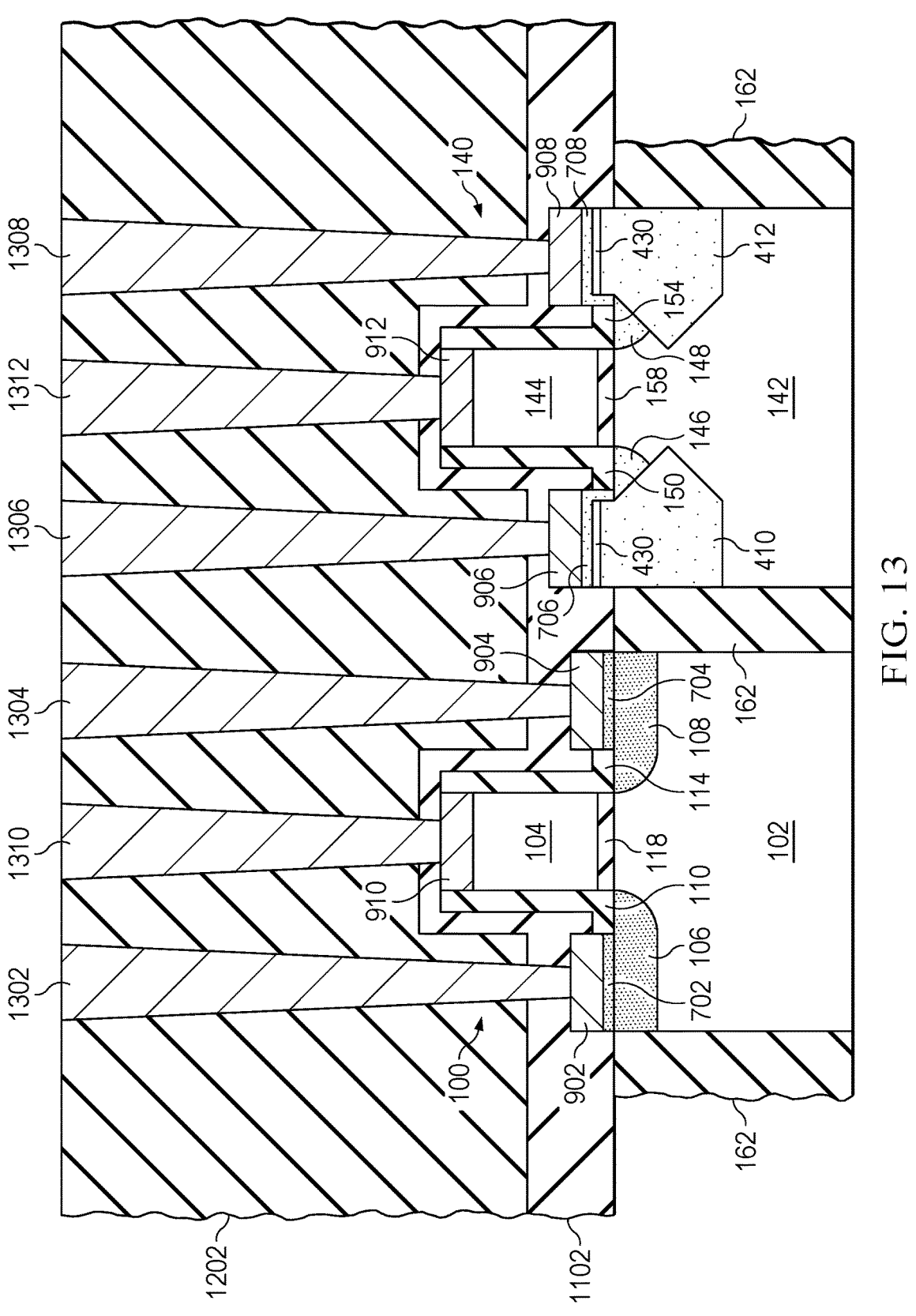
FIG. 13 is a cross-sectional view illustrating the final structure of the NFET and PFET with raised source/drain structures, in accordance with an example.

In FIG. 11, a pre-metal dielectric (PMD) layer 1102 is formed over transistors 100 and 140. PMD layer 1102 may include silicon oxynitride (e.g., SiOxNy, x>>0.5). FIG. 12 illustrates that PMD fill (1202) is performed via a deposition process. The material forming the PMD fill 1202 may be an oxide or low-K dielectric. Chemical mechanical planarization (CMP) may then be performed. Contact pattern and etching followed by barrier and plug formation is performed resulting in the final structure shown in FIG. 13. Conductive elements 1302, 1304, and 1310 form electrical contact to the raised source/drain and gate 104 of NFET 100. Conductive elements 1306, 1308, and 1312 form electrical contact to the raised source/drain and gate 144 of PFET 140.

Modifications to the described embodiments and other embodiments are possible and within the scope of the claims. For example, in some embodiments, the NFET 100 includes silicon carbide (SiC) regions within at least some portions of the n-type lightly doped extension regions 106 and 108 (and some portions of the PWELL 102) similar to the SiGe regions 410 and 412 formed within at least some of the p-type lightly doped extension regions 146 and 148 (and some portions of the NWELL 142). SiC forms a crystalline structure. The lattice constant of the SiC crystalline structure is smaller than that of the underlying silicon (n-type lightly doped extension regions 106, 108 or PWELL 102). Because of the smaller lattice constant of the crystalline SiC regions, the SiC regions are expected to exert tensile force in the area just below the gate dielectric layer 118 where the transistor's channel will form. The stress caused by the tensile force exerted by the SiC regions advantageously causes an increase in electron mobility (the carrier conducting current between the source and drain when the NFET 100 turns on) through the NFET's channel.

What is claimed is:

1. A method, comprising:
forming a first gate and a second gate on a substrate;
forming a p-doped region adjacent the first gate and in an n-type well;
forming an n-doped region adjacent the second gate and in a p-type well;
forming a silicon germanium (SiGe) region in a portion of the p-doped region in the n-type well; and
simultaneously forming raised source-drain structures over the SiGe region and on the n-doped region.

2. The method of claim 1, further comprising:
forming first spacers along sidewalls of the first and second gates; and
forming second spacers on a side of the first spacers opposite the first and second gates.

3. The method of claim 2, further comprising removing the second spacers after simultaneously forming the raised source-drain structures.

4. The method of claim 2, further comprising:
doping the raised source-drain structures on the n-doped region with an n-type dopant;
doping the raised source-drain structures on the SiGe region with a p-type dopant; and
removing the second spacers after doping the raised source-drain structures on the n-doped region and doping the raised source-drain structures on the SiGe region.

5. The method of claim 1, further comprising:
forming a mask resistant to SiGe formation over the second gate and the n-doped region, wherein forming the SiGe region is performed after forming the mask; and
removing the mask prior to simultaneously forming the raised source-drain structures.

6. The method of claim 5, wherein the mask comprises silicon nitride.

7. The method of claim 5, wherein the mask comprises a first silicon nitride, and the method further comprises:
forming first spacers along sidewalls of the first and second gates, the first spacers comprising oxide; and
forming second spacers on a side of the first spacers opposite the first and second gates, the second spacers comprising a second silicon nitride; and
wherein removing the mask comprises removing the mask without removing the second spacers.

8. The method of claim 1, further comprising forming a silicon carbide (SiC) region in a portion of the n-doped region.

9. The method of claim 1, wherein simultaneously forming the raised source-drain structures comprises forming a raised source-drain structure over at least a portion of the SiGe region and on at least a portion of the p-doped region.

10. The method of claim 1, further comprising:
forming a silicon capping layer over the SiGe region.

11. The method of claim 10, further comprising:
forming a silicon overfill region on the silicon capping layer and on at least a portion of the p-doped region, wherein at least one raised source-drain structure of the raised source-drain structures is formed in the silicon overfill region.

12. A method, comprising:
forming a first gate and a second gate on a substrate;
forming a p-doped region adjacent the first gate and in an n-type well;
forming an n-doped region adjacent the second gate and in a p-type well;
forming a mask resistant to silicon germanium (SiGe) formation over the second gate and the n-doped region;
forming a SiGe region in a portion of the p-doped region in the n-type well;
removing the mask after forming the SiGe region; and
simultaneously forming raised source-drain structures over the SiGe region and on the n-doped region.

13. The method of claim 12, wherein the mask comprises silicon nitride.

14. The method of claim 12, further comprising:
forming first spacers along sidewalls of the first and second gates, the first spacers having L-shaped cross-sections, the L-shaped cross-sections having ledges; and
forming second spacers on the ledges and a side of the first spacers opposite the first and second gates.

15. The method of claim 14, further comprising:
removing the second spacers after simultaneously forming the raised source-drain structures.

16. The method of claim 12, wherein simultaneously forming the raised source-drain structures comprises:
forming a raised source-drain structure over at least a portion of the SiGe region and on at least a portion of the p-doped region.

17. An apparatus, comprising:
an n-channel field effect transistor (NFET) having a raised source and a raised drain; a p-channel field effect transistor (PFET) having a raised source, a raised drain, and a gate and having a first silicon germanium (SiGe) region and a second SiGe region adjacent the gate; and
a first p-doped region and a second p-doped region, the first SiGe region formed in the first p-doped region and the second SiGe region formed in the second p-doped region.

18. The apparatus of claim 17, further comprising:
first spacers along sidewalls of the gate; and
second spacers on a side of the first spacers opposite the gate.

19. The apparatus of claim 18, wherein the first spacer has an L-shaped cross-section, the L-shaped cross-section having a ledge on which the second spacer is positioned.

20. The apparatus of claim 18, wherein the first spacers comprise oxide, and the second spacers comprise silicon nitride.

21. The apparatus of claim 17, further comprising:

an n-type well and a p-type well, wherein the first p-doped region and the second p-doped region are in the n-type well, and wherein the raised source of the PFET is formed over at least portions of the first SiGe region and the first p-doped region, and wherein the raised drain of the PFET is formed over at least portions of the second SiGe region and the second p-doped region.

22. The apparatus of claim 17, wherein the NFET comprises an NFET gate and first and second silicon carbide regions adjacent to the NFET gate.

23. The apparatus of claim 17, further comprising:

a first silicon capping layer on the first SiGe region and a second silicon capping layer on the second SiGe region.

24. The apparatus of claim 23, further comprising:

a first silicon overfill region on the first silicon capping layer and at least a portion of the first p-doped region, wherein the raised drain of the PFET is formed in the first silicon overfill region; and a second silicon overfill region on the second silicon capping layer and at least a portion of the second p-doped region; wherein the raised source of the PFET is formed in the second silicon overfill region.

* * * * *